US009628099B2

United States Patent
Sakurai

(10) Patent No.: US 9,628,099 B2
(45) Date of Patent: Apr. 18, 2017

(54) LOAD CURRENT COMPENSATION FOR ANALOG INPUT BUFFERS

(71) Applicant: Texas Instruments Incorporated, Dallas, TX (US)

(72) Inventor: Satoshi Sakurai, San Carlos, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/858,264

(22) Filed: Sep. 18, 2015

(65) Prior Publication Data

US 2016/0164534 A1 Jun. 9, 2016

Related U.S. Application Data

(60) Provisional application No. 62/088,308, filed on Dec. 5, 2014.

(51) Int. Cl.
  *H03M 1/66* (2006.01)
  *H03M 1/12* (2006.01)
  (Continued)

(52) U.S. Cl.
  CPC ........... *H03M 1/1245* (2013.01); *G11C 27/02* (2013.01); *H03K 19/01812* (2013.01); *H03M 1/12* (2013.01)

(58) Field of Classification Search
  CPC ....... H03M 1/1245; H03M 1/12; G11C 27/02; H03K 19/01812
  (Continued)

(56) References Cited

U.S. PATENT DOCUMENTS 6,424,225 B1 * 7/2002 Choi ................. H03F 1/302
  323/312
6,696,869 B1 * 2/2004 Tan .................. H03F 3/45183
  327/108

(Continued)

OTHER PUBLICATIONS

PCT Search Report for Application No. PCT/US 2015/064191, dated Oct. 27, 2016.

*Primary Examiner* — Brian Young
(74) *Attorney, Agent, or Firm* — Andrew Viger; Charles A. Brill; Frank D. Cimino

(57) ABSTRACT

Systems and methods for load current compensation for analog input buffers. In various embodiments, an input buffer may include a first transistor ($Q_1$) having a collector terminal coupled to a power supply node and a base terminal coupled to a first input node ($v_{inp}$); a second transistor ($Q_2$) having a collector terminal coupled to an emitter terminal of the first transistor ($Q_1$); a third transistor ($Q_3$) having an emitter terminal coupled to an emitter terminal of the second transistor ($Q_2$) and to a ground node, a collector terminal coupled to a current source ($I_{bias}$), and a base terminal coupled the collector terminal and to a base terminal of the second transistor ($Q_2$); and a capacitor ($C_1$) coupled to the base terminals of the second and third transistors ($Q_2$ and $Q_3$) and to a second input node ($v_{inn}$), wherein the first and second input nodes ($v_{inp}$ and $v_{inn}$) are differential inputs.

20 Claims, 4 Drawing Sheets

(51) Int. Cl.
*H03K 19/018* (2006.01)
*G11C 27/02* (2006.01)

(58) Field of Classification Search
USPC .................................................. 341/155, 144
See application file for complete search history.

(56) References Cited

U.S. PATENT DOCUMENTS

| | | | |
|---|---|---|---|
| 7,064,614 B2 * | 6/2006 | Feng | ....................... H03F 3/343 330/288 |
| 9,130,519 B1 * | 9/2015 | Keramat | .................... H03F 1/02 |
| 2002/0118043 A1 | 8/2002 | Enam et al. | |
| 2011/0199130 A1 | 8/2011 | Hu et al. | |
| 2011/0261177 A1 | 10/2011 | Moore | |

\* cited by examiner

LOAD CURRENT COMPENSATION FOR ANALOG INPUT BUFFERS

CROSS-REFERENCE TO RELATED APPLICATIONS

This application claims priority to U.S. Provisional Patent Application Ser. No. 62/088,308 titled "LOAD CURRENT COMPENSATION TECHNIQUE FOR LOW-VOLTAGE LOW-POWER HIGH-SPEED ANALOG INPUT BUFFER CIRCUIT WITH HIGH-LINEARITY" and filed on Dec. 5, 2014, which is incorporated by reference herein.

TECHNICAL FIELD

This specification is directed, in general, to electronic circuits, and, more specifically, to systems and methods for load current compensation for analog input buffers.

BACKGROUND

An analog-to-digital converter (ADC) is a device that converts a continuous physical quantity (e.g., a voltage) to a digital number that represents the quantity's amplitude. The conversion involves quantization (or sampling) of the input, which the ADC performs periodically. The result is a sequence of digital values that have been converted from a continuous-time and continuous-amplitude analog signal to a discrete-time and discrete-amplitude digital signal.

High-speed high-performance ADCs use switched-capacitor based input sampling network. Large capacitors switched on and off at high sample speed make it difficult for the external circuits to drive the ADCs. In order to minimize such difficulties, high-performance on-chip analog input buffers are inserted in front of the ADCs. The on-chip analog input buffer needs to maintain high linearity (85 dB) at very high frequencies (in the order of 500 MHz), while driving a large capacitor (in the order of 3 pF) being switched at very high sampling speed (500 Msps).

Because there is no industry standardization regarding ADC input structures, however, each ADC must be examined on its own before an input interface circuitry is designed. In many implementations, the analog input to an ADC is connected directly to a sample-and-hold capacitor, which generates transient currents that must be buffered from the signal source. And in those cases, an analog buffer may be provided.

Turning to FIG. 1, an example of a conventional analog input buffer is provided. Particularly, buffer 100 includes emitter-follower transistor Q1 configured to receive input signal $v_{in}$ at its base terminal and thereby allowing current $I_{Q1}$ to develop. The node between transistors $Q_1$ and $Q_2$ provide output $v_o$ across capacitor $C_L$, which models the sample-and-hold capacitor within an ADC. Current $I_{Q1}$ is divided between $I_{Q2}$ (through $Q_2$) and $I_{CL}$ (through $C_L$). Transistors $Q_3$ and $Q_2$ are in a current mirror configuration as shown, where the collector terminal of $Q_3$ is coupled to current source $I_{bias}$.

In buffer 100, current $I_{CL}$ is a dynamically changing, time-varying current; which means that current $I_{Q1}$ effectively contains an AC component (because $I_{Q1}=I_{Q2}+I_{CL}$). When the input signal amplitude is large and the input frequency is high, the current flowing in the large sample capacitor of the ADC is a large AC current. This AC current combines with the DC bias current and flows through the emitter-follower device. This results in non-linear operation of the emitter follower and the signal being fed to the ADC becomes distorted. Therefore, to ensure linear operation of the circuit, $I_{Q2}$ must usually be provided as a DC bias current (that is, a mirror of $I_{bias}$) that is much larger than $I_{CL}$.

FIG. 2 provides an example of a prior art input buffer design that can provide higher linearity with a smaller $I_{bias}$. Buffer 200 is similar to buffer 100, but with the addition of cascode transistor $Q_4$ and capacitor $C_1$ as shown. Cascode transistor $Q_4$ is biased with $v_B$, and $C_1$ is coupled between $v_{in}$ and the emitter terminals of transistor $Q_4$. The AC voltage across $C_1$ is similar to the AC voltage across $C_L$, therefore $I_{C1}=I_{CL}$ for the case where $C_1=C_L$. Moreover, in such a situation, $I_{Q1}$ is equal to $I_{Q2}$ and is proportional to the constant current $I_{bias}$.

SUMMARY

Systems and methods for load current compensation for analog input buffers are described. In an illustrative, non-limiting embodiment, an input buffer may include a first transistor ($Q_1$) having a collector terminal coupled to a power supply node and a base terminal coupled to a first input node ($v_{inp}$); a second transistor ($Q_2$) having a collector terminal coupled to an emitter terminal of the first transistor ($Q_1$); a third transistor ($Q_3$) having an emitter terminal coupled to an emitter terminal of the second transistor ($Q_2$) and to a ground node, a collector terminal coupled to a current source ($I_{bias}$), and a base terminal coupled the collector terminal and to a base terminal of the second transistor ($Q_2$); and a capacitor ($C_1$) coupled to the base terminals of the second and third transistors ($Q_2$ and $Q_3$) and to a second input node ($v_{inn}$), wherein the first and second input nodes ($v_{inp}$, and $v_{inn}$) are differential inputs.

An output node ($v_{op}$) between the emitter terminal of the first transistor ($Q_1$) and the collector terminal of the second transistor ($Q_2$) may be coupled to an input of an analog-to-digital converter (ADC). The output node ($v_{op}$) may be coupled to a sample-and-hold capacitor ($C_L$) of the analog-to-digital converter (ADC). The second transistor ($Q_2$) may have a first size, wherein the third transistor ($Q_3$) may have a second size, and a ratio between the first and second sizes is n.

In various implementations, n may have a value between 2 and 5. A capacitance of the sample-and-hold capacitor ($C_L$) may be n times larger than a capacitance of the capacitor ($C_1$). Also, a current ($I_{Q1}$) through the first transistor ($Q_1$) may be n times larger than a biasing current ($I_{bias}$) provided by the current source.

In an illustrative, non-limiting embodiment, a differential input buffer may include an emitter-follower transistor ($Q_{1S}$) having a collector terminal coupled to a power supply node, a base terminal coupled to a first differential input node ($v_{inp}$), and an emitter terminal coupled to a first current source ($I_{bias2}$); a first transistor ($Q_1$) having a collector terminal coupled to the power supply node and a base terminal coupled to the base terminal of the first emitter-follower transistor ($Q_{1S}$) and to the first differential input node ($v_{inp}$); a second transistor ($Q_2$) having a collector terminal coupled to an emitter terminal of the first transistor ($Q_1$); a third transistor ($Q_3$) having an emitter terminal coupled to an emitter terminal of the second transistor ($Q_2$) and to a ground node, a collector terminal coupled to a second current source ($I_{bias}$), and a base terminal coupled the collector terminal and to a base terminal of the second transistor ($Q_2$); and a capacitor ($C_1$) coupled to the base terminals of the second and third transistors ($Q_2$ and $Q_3$) and to a first input node ($v_{onx}$).

A first differential output node ($v_{op}$) between the emitter terminal of the first transistor ($Q_1$) and the collector terminal of the second transistor ($Q_2$) may be coupled to a first differential input of an analog-to-digital converter (ADC) comprising a sample-and-hold capacitor ($C_L$). The second transistor ($Q_2$) may have a first size, the third transistor ($Q_3$) may have a second size, a ratio between the first and second sizes may be n, a capacitance of the sample-and-hold capacitor ($C_L$) may be n times larger than a capacitance of the capacitor ($C_1$), and a current ($I_{Q1}$) through the first transistor ($Q_1$) may be n times larger than a biasing current ($I_{bias}$) provided by the second current source.

The differential input buffer may also include another emitter-follower transistor ($Q_{1SN}$) having a collector terminal coupled to the power supply node, a base terminal coupled to a second differential input node ($v_{inn}$), and an emitter terminal coupled to a third current source ($I_{bias2N}$); a fourth transistor ($Q_{IN}$) having a collector terminal coupled to the power supply node and a base terminal coupled to the base terminal of the other emitter-follower transistor ($Q_{1SN}$) and to the second differential input node ($v_{inn}$); a fifth transistor ($Q_{2N}$) having a collector terminal coupled to an emitter terminal of the fourth transistor ($Q_{1N}$); and a sixth transistor ($Q_{3N}$) having an emitter terminal coupled to an emitter terminal of the fifth transistor ($Q_{2N}$) and to a ground node, a collector terminal coupled to a third current source ($I_{biasN}$), and a base terminal coupled the collector terminal and to a base terminal of the fifth transistor ($Q_{2N}$); and another capacitor ($C_{1N}$) coupled to the base terminals of the fifth and sixth transistors ($Q_{2N}$ and $Q_{3N}$) and to a second input node ($v_{opx}$).

A second differential output node ($v_{on}$) between the emitter terminal of the fourth transistor ($Q_{1N}$) and the collector terminal of the fifth transistor ($Q_{2N}$) is coupled to a second differential input of the analog-to-digital converter (ADC). A node between the emitter terminal of the emitter-follower transistor ($Q_{1S}$) and the first current source ($I_{bias2}$) provides the voltage at the second input node ($v_{opx}$). And node between the emitter terminal of the other emitter-follower transistor ($Q_{1SN}$) and the third current source ($I_{bias2N}$) provides the voltage at the first input node ($v_{onx}$).

In another illustrative, non-limiting embodiment, a programmable input buffer may include a first transistor ($Q_1$) having a collector terminal coupled to a power supply node and a base terminal coupled to an input node ($v_{inp}$); a second transistor ($Q_2$) having a collector terminal coupled to an emitter terminal of the first transistor ($Q_1$); a third transistor ($Q_3$) having an emitter terminal coupled to an emitter terminal of the second transistor ($Q_2$) and to a ground node, a collector terminal coupled to a current source ($I_{bias}$), and a base terminal coupled the collector terminal and to a base terminal of the second transistor ($Q_2$); and a plurality of capacitors ($C_{1A-X}$), each coupled to the base terminals of the second and third transistors ($Q_2$ and $Q_3$) via a respective switch ($M_{1A-X}$).

An output node ($v_{op}$) between the emitter terminal of the first transistor ($Q_1$) and the collector terminal of the second transistor ($Q_2$) may be coupled to an input of an analog-to-digital converter (ADC). The output node ($v_{op}$) may be coupled to a sample-and-hold capacitor ($C_L$) of the analog-to-digital converter (ADC). The second transistor ($Q_2$) may have a first size, the third transistor ($Q_3$) may have a second size, and a ratio between the first and second sizes may be n. The plurality of switches ($M_{1A-X}$) may be configured to increase or decrease a combined capacitance of the plurality of capacitors ($C_{1A-X}$) to match a capacitance of the sample-and-hold capacitor ($C_L$). Moreover, the capacitance of the sample-and-hold capacitor ($C_L$) may be n times larger than the combined capacitance of the plurality of capacitors ($C_{1A-X}$), and a current ($I_{Q1}$) through the first transistor ($Q_1$) may be n times larger than a biasing current ($I_{bias}$) provided by the current source.

BRIEF DESCRIPTION OF THE DRAWINGS

Figure 1:
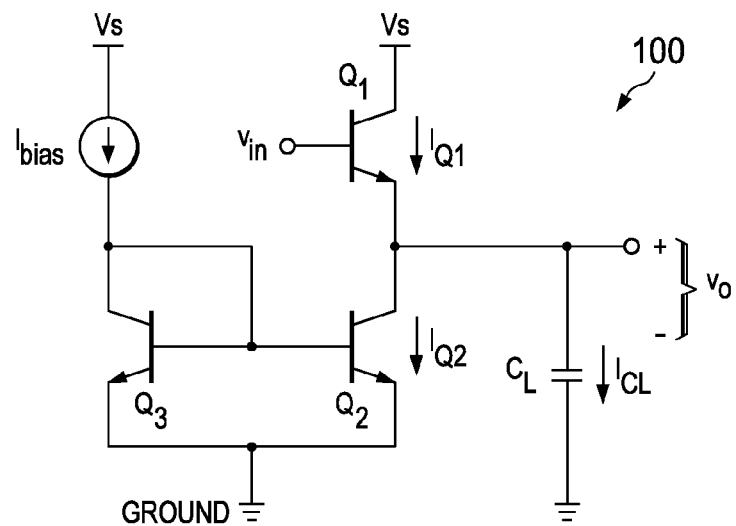

Having thus described the invention(s) in general terms, reference will now be made to the accompanying drawings, wherein:

FIG. 1 is a circuit diagram of an example a conventional analog input buffer.

Figure 2:
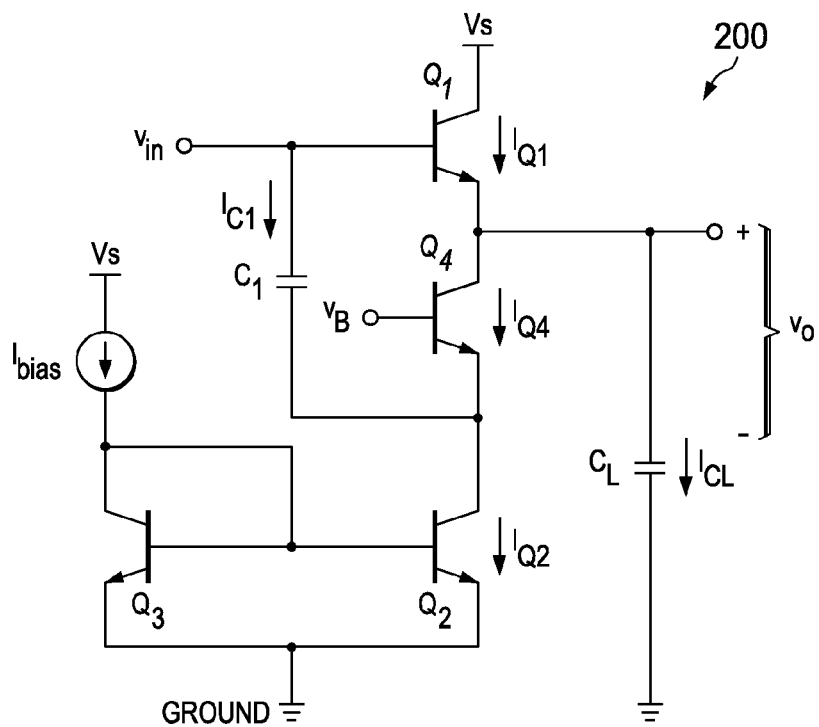

FIG. 2 is a circuit diagram of an example of a prior art approach to designing an input buffer that can provide higher linearity with a smaller bias current.

Figure 3:
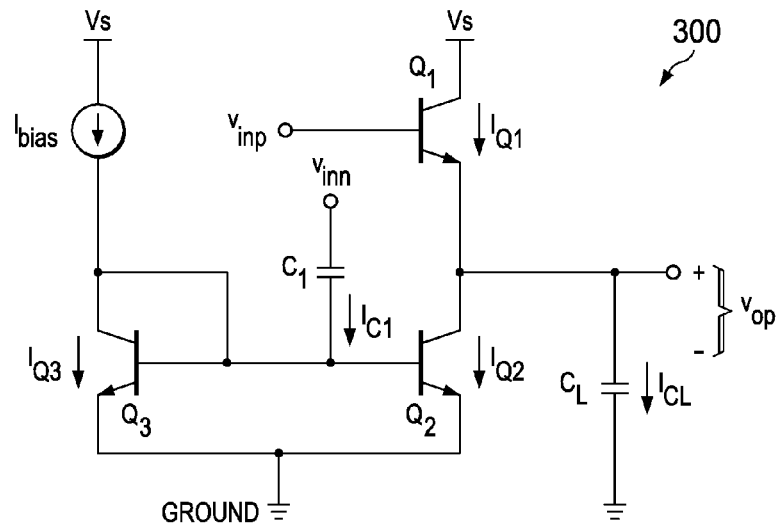

FIG. 3 is a circuit diagram of an example of a load current compensation circuit according to some embodiments.

Figure 4:
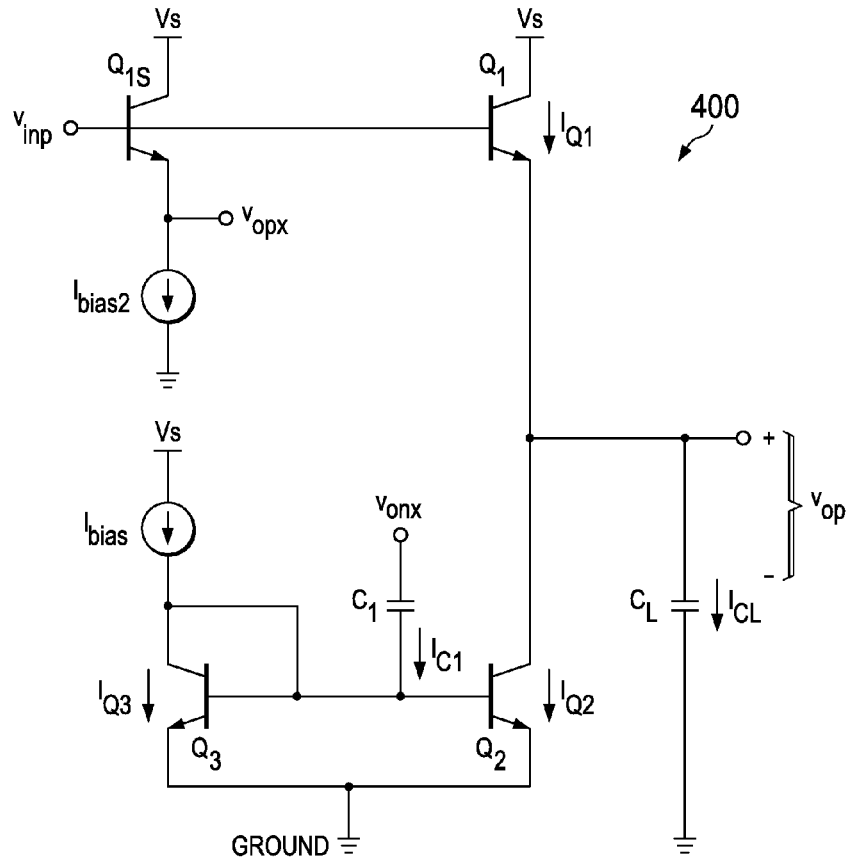
Figure 5:
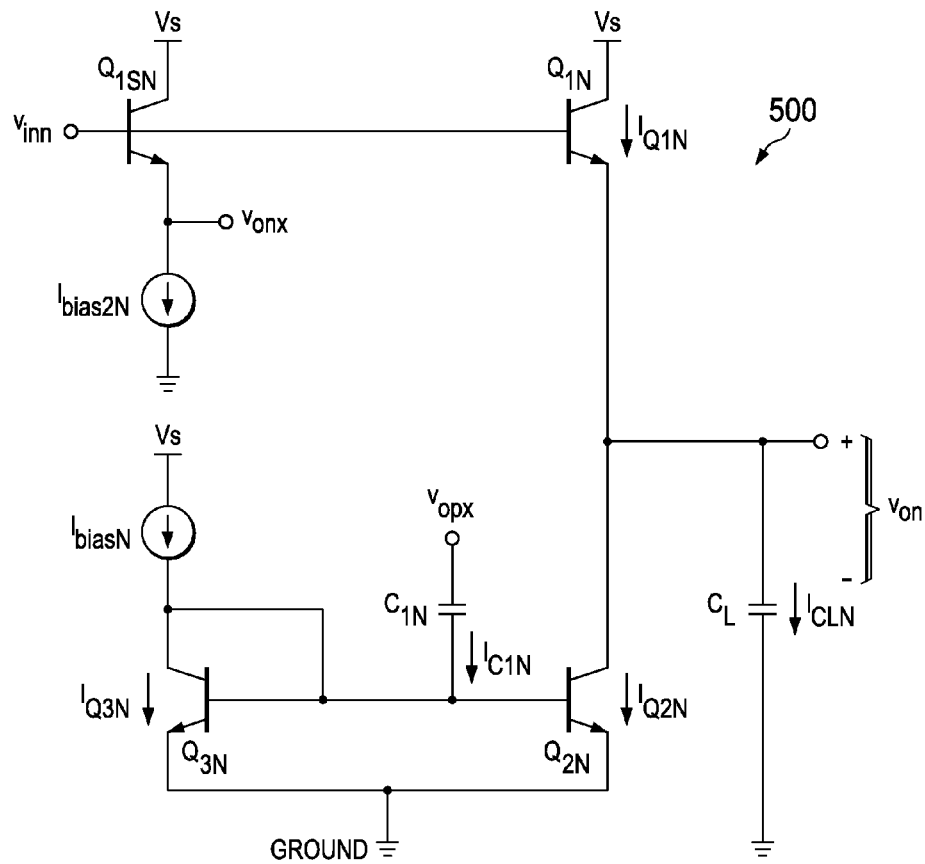

FIGS. 4 and 5 are circuit diagrams of an example of a differential input buffer having load compensation circuits according to some embodiments.

Figure 6:
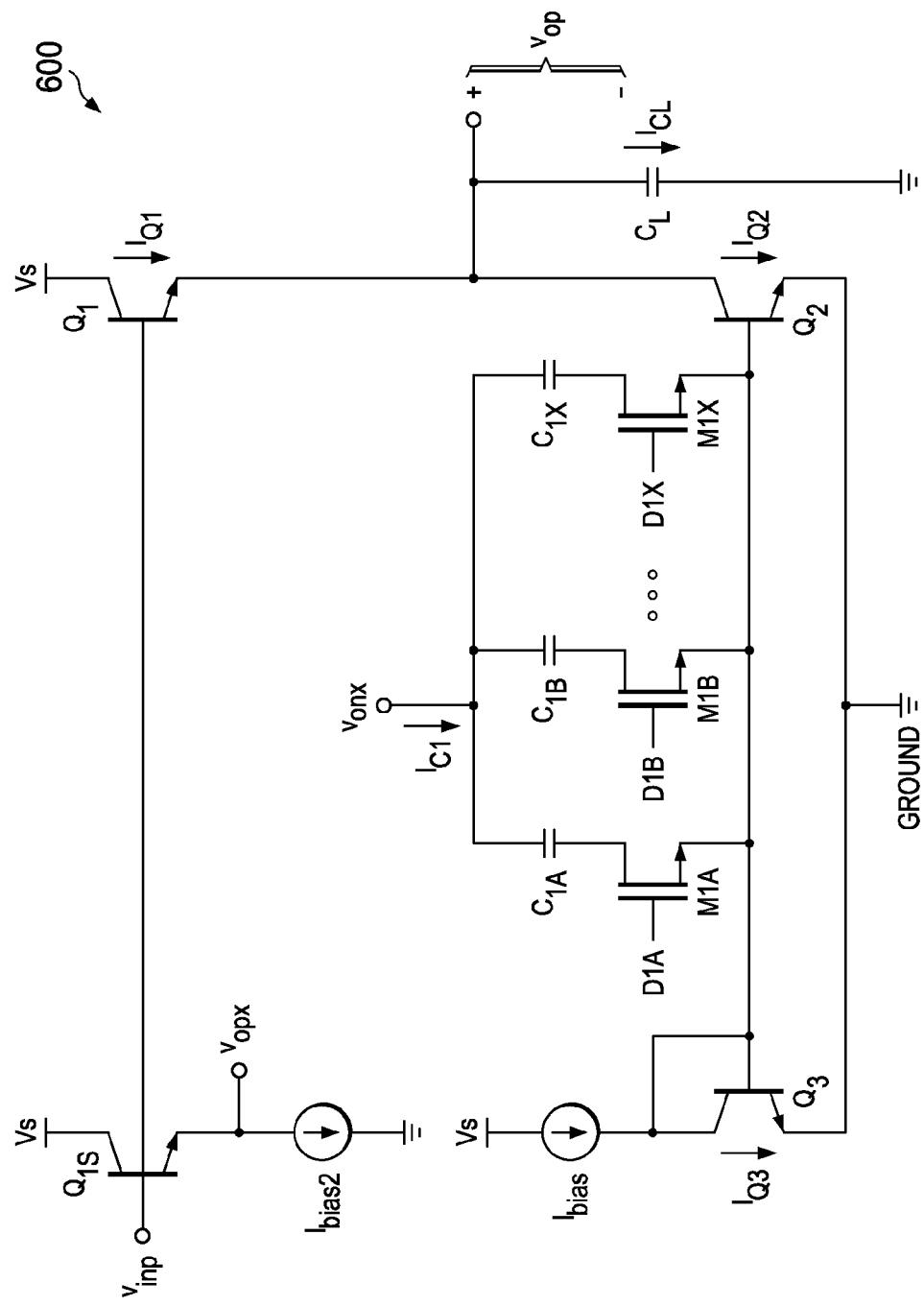

FIG. 6 is a circuit diagram of an example of a programmable load compensation circuit according to some embodiments.

Figure 7:
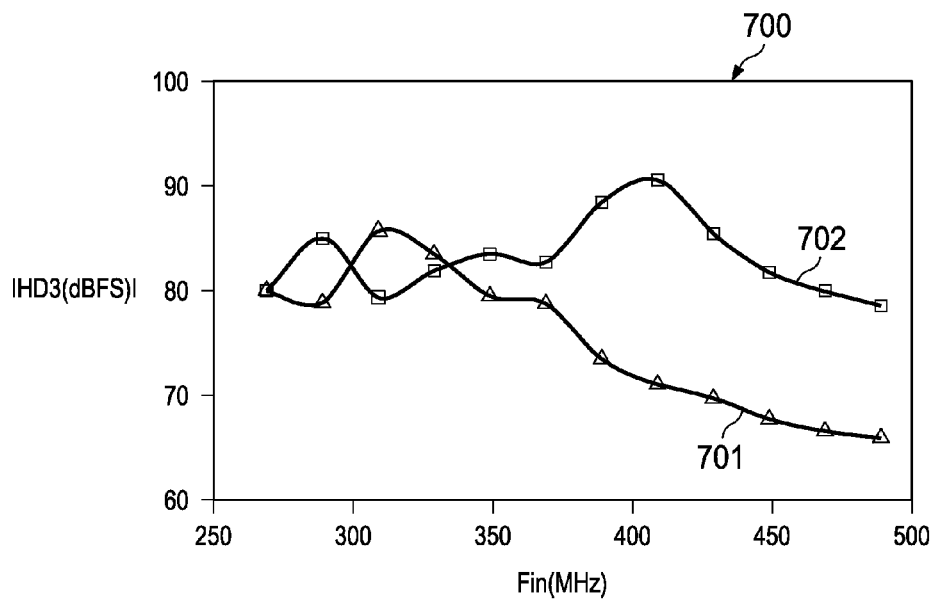

FIG. 7 is a graph comparing the linearity of an input buffer circuit according to some embodiments versus a that of a prior art input buffer circuit.

DETAILED DESCRIPTION

The invention(s) now will be described more fully hereinafter with reference to the accompanying drawings. The invention(s) may, however, be embodied in many different forms and should not be construed as limited to the embodiments set forth herein. Rather, these embodiments are provided so that this disclosure will be thorough and complete, and will fully convey the scope of the invention(s) to a person of ordinary skill in the art. A person of ordinary skill in the art may be able to use the various embodiments of the invention(s).

The inventor has identified a number of problems with the prior art input buffer design of FIG. 2. For example, by adding $Q_4$ in series with $Q_1$, circuit 200 requires a larger operating voltage than circuit 100. If the collector-emitter voltage of each transistor is 400 mV, for example, the addition of Q4 requires that the supply voltage (coupled to the collector terminal of $Q_1$) be increased by at least the same amount. Also, the input current contains an AC current $I_{C1}$, which can be large and can complicate the operation of an ADC driver. To address these and other problems, systems and methods described herein provide load current compensation circuits for analog input buffers. Using these circuits and techniques, embodiments described herein enable low-voltage, low-power, and high-speed operation with high-linearity.

FIG. 3 is a circuit diagram of an example of a load current compensation circuit according to some embodiments. In particular, input buffer 300 includes a first transistor ($Q_1$) having a collector terminal coupled to a power supply ($V_s$) node and a base terminal coupled to a first input node ($V_{inp}$). Input buffer 300 also includes a second transistor ($Q_2$) having a collector terminal coupled to an emitter terminal of the first transistor ($Q_1$). Input buffer 300 further includes a third transistor ($Q_3$) having an emitter terminal coupled to an emitter terminal of the second transistor ($Q_2$) and to a ground node, a collector terminal coupled to a current source ($I_{bias}$), and a base terminal coupled the collector terminal and to a base terminal of the second transistor ($Q_2$).

Moreover, input buffer 300 includes a capacitor ($C_1$) coupled to the base terminals of the second and third transistors ($Q_2$ and $Q_3$) and to a second input node ($v_{inn}$), where the first and second input nodes ($v_{inp}$, and $v_{inn}$) are differential inputs.

An output node ($v_{op}$) between the emitter terminal of the first transistor ($Q_1$) and the collector terminal of the second transistor ($Q_2$) is coupled to an input of an analog-to-digital converter (ADC). As shown, the output node ($v_{op}$) is coupled to a sample-and-hold capacitor ($C_L$) of the ADC.

In various implementations, the second transistor ($Q_2$) may have a first size $m_2$ the third transistor ($Q_3$) may have a second size $m_3$, and the ratio between the first and second sizes may be selected as n (such that $Q_2$ is larger than $Q_3$). For example, in some cases n may have a value between 2 and 5. As such, the capacitance of the sample-and-hold capacitor ($C_L$) may be n times larger than a capacitance of the capacitor ($C_1$), and a current ($I_{Q1}$) through the first transistor ($Q_1$) is n times larger than a biasing current ($I_{bias}$) provided by the current source.

Among other features, input buffer 300 allows $C_1$ to be scaled down by a factor of n (compared to $C_L$), thus reducing the circuit's footprint. Moreover, because transistor Q4 of FIG. 2 is not used in this embodiment, input buffer 300 may be configured to operate with a lower supply voltage ($V_S$).

In handling high-speed high-linearity analog signals, most circuits use differential architecture to improve the dynamic performances (SNR, SFDR, THD, etc.). Thus, the differential counterpart to a signal is readily available within the circuit.

Load current compensation in circuit 300 is achieved without the use of the cascode device in series with the current source $Q_2$; however, is achieved through injection of $I_{C1}$ at the current mirror used provide the bias current to the emitter-follower. Note that $I_{C1}$ needs to be 180 degrees phase shifted from $I_{CL}$; this is done by putting an AC voltage across $C_1$ with opposite sign from $v_{op}$. With this approach, $I_{Q1}$=n*$I_{bias}$, where n is the ratio of the device sizes of $Q_2$ to $Q_3$. Then the resulting current flowing though $Q_1$ is constant even in the presence of an AC load current. Without the need for the cascode device, the minimum output voltage is the collector-emitter saturation voltage of $Q_2$. Moreover, when $_n$>1 is chosen, the input current is reduced by the factor $_n$ compared to the load current. This reduction in the input current helps the external driver circuit; however, n cannot be made to infinity and thus there will be some AC current at the input.

In order to completely remove the AC component from the input buffer inputs, FIGS. 4 and 5 show the complete differential input buffer. In addition, it contains $Q_{1S}$ and $Q_{1SN}$ which generate $V_{opx}$ and $V_{onx}$, respectively. Bias currents for $Q_{1S}$ and $Q_{1SN}$ can be made much smaller than that of the main emitter followers. $V_{opx}$ and $V_{onx}$ are used to generate $I_{C1N}$ and $I_{C1}$, respectively. These currents are provide by $Q_{1S}$ and $Q_{1SN}$ and thus are longer needed to be supplies by the external driver circuits.

Particularly, in circuit 400, an emitter-follower transistor ($Q_{1S}$) has a collector terminal coupled to a power supply node, a base terminal coupled to a first differential input node ($v_{inp}$), and an emitter terminal coupled to a first current source ($I_{bias2}$). Circuit 400 also includes a first transistor ($Q_1$) having a collector terminal coupled to the power supply node and a base terminal coupled to the base terminal of the first emitter-follower transistor ($Q_{1S}$) and to the first differential input node ($v_{inp}$), a second transistor ($Q_2$) having a collector terminal coupled to an emitter terminal of the first transistor ($Q_1$), and a third transistor ($Q_3$) having an emitter terminal coupled to an emitter terminal of the second transistor ($Q_2$) and to a ground node, a collector terminal coupled to a second current source ($I_{bias}$), and a base terminal coupled the collector terminal and to a base terminal of the second transistor ($Q_2$).

Circuit 400 further includes a capacitor ($C_1$) coupled to the base terminals of the second and third transistors ($Q_2$ and $Q_3$) and to a first input node ($v_{onx}$). A first differential output node ($v_{op}$) between the emitter terminal of the first transistor ($Q_1$) and the collector terminal of the second transistor ($Q_2$) is coupled to a first differential input of an analog-to-digital converter (ADC) comprising a sample-and-hold capacitor ($C_L$).

In various implementations, the second transistor ($Q_2$) has a first size, the third transistor ($Q_3$) has a second size, a ratio between the first and second sizes is n, a capacitance of the sample-and-hold capacitor ($C_L$) is n times larger than a capacitance of the capacitor ($C_1$), and a current ($I_{Q1}$) through the first transistor ($Q_1$) is n times larger than a biasing current ($I_{bias}$) provided by the second current source.

Meanwhile, circuit 500 includes another emitter-follower transistor ($Q_{1SN}$) having a collector terminal coupled to the power supply node, a base terminal coupled to a second differential input node ($v_{inn}$), and an emitter terminal coupled to a third current source ($I_{bias2N}$) Circuit 500 also includes a fourth transistor ($Q_{1N}$) having a collector terminal coupled to the power supply node and a base terminal coupled to the base terminal of the other emitter-follower transistor ($Q_{1SN}$) and to the second differential input node ($v_{inn}$), a fifth transistor ($Q_{2N}$) having a collector terminal coupled to an emitter terminal of the fourth transistor ($Q_{1N}$), and a sixth transistor ($Q_{3N}$) having an emitter terminal coupled to an emitter terminal of the fifth transistor ($Q_{2N}$) and to a ground node, a collector terminal coupled to a third current source ($I_{biasN}$), and a base terminal coupled the collector terminal and to a base terminal of the fifth transistor ($Q_{2N}$).

Circuit 500 further includes another capacitor ($C_{1N}$) coupled to the base terminals of the fifth and sixth transistors ($Q_{2N}$ and $Q_{3N}$) and to a second input node ($v_{opx}$). A second differential output node ($v_{on}$) between the emitter terminal of the fourth transistor ($Q_{1N}$) and the collector terminal of the fifth transistor ($Q_{2N}$) is coupled to a second differential input of the analog-to-digital converter (ADC).

In various embodiments, a node between the emitter terminal of the emitter-follower transistor ($Q_{1S}$) and the first current source ($I_{bias2}$) provides the voltage at the second input node ($v_{opx}$), whereas a node between the emitter terminal of the other emitter-follower transistor ($Q_{1SN}$) and the third current source ($I_{bias2N}$) provides the voltage at the first input node ($v_{onx}$)

Among other features, input buffers 400 and 500 may be used in combination to drive an ADC with differential inputs. And, in addition having some of the same characteristics of input buffer 300, input buffers 400 for example further isolates $C_1$ from $v_{inn}$ (because C1 is coupled to $v_{onx}$).

The AC load current of the input buffer is proportional to the total load capacitance, $C_L$, seen by the input buffer. The value of $C_L$ is dominated by the sampling capacitor of the ADC; however, there are many parasitic components that will add to $C_L$. Parasitic capacitances are difficult to predict exactly. Because of this, in order to generate the load compensation current that is very close to the actual load current, $C_1$ used to generate the replica load current may be made to be digitally programmable. For example, $C_1$ may be split into many pieces, $C_{1A}, C_{1B} \ldots C_{1X}$. The capacitors are connected to MOS switches which are turned on or off by digitally control voltages $D_{1A}, D_{1B} \ldots D_{1X}$. They can be used to generate the optimal load compensation current that results in the best dynamic performance of the input buffer.

To illustrate the foregoing, FIG. 6 is a circuit diagram of an example of a programmable load compensation circuit according to some embodiments. Input buffer 600 is similar to buffers 300-500, but it also includes a plurality of capacitors ($C_{1A-X}$), each coupled to the base terminals of the second and third transistors ($Q_2$ and $Q_3$) via a respective switch ($M_{1A-X}$). In various embodiments, switches ($M_{1A-X}$) may be configured to increase or decrease a combined capacitance of the plurality of capacitors ($C_{1A-X}$) to match a capacitance of the sample-and-hold capacitor ($C_L$). The capacitance of the sample-and-hold capacitor ($C_L$) is n times larger than the combined capacitance of the plurality of capacitors ($C_{1A-X}$).

Among other features, input buffer 600 may be used to enable programming an effective value for $C_1$ based upon the actual load presented by the ADC. Such programming may be performed, for example, after the electronic components have been manufactured in silicon. In some cases a corresponding differential buffer, otherwise similar to buffer 600, may be used to drive an ADC with differential inputs.

FIG. 7 is a graph comparing the linearity of an input buffer circuit according to some embodiments versus that of a prior art input buffer circuit. Specifically, graph 700 shows the measured third order harmonic distortion (the "HD3" axis) against the frequency (the "Fin" axis) of an input signal at $V_{inp}$-$V_{inn}$ nodes. Curve 701 shows that, at high frequencies (above approximately 370 MHz), the linearity of the prior art input buffer circuit drops by several dB, while curve 702 shows that an input buffer as described herein maintains linear operation in that same frequency range.

In sum, the techniques described herein do not need a cascode device inserted in series with the emitter-follower's current source to subtract the replica load compensation current. Instead, the subtraction is done at the current mirror input terminal. The cascode device would have increased the minimum required voltage of the input buffer output node by $V_{CE\_SAT}$, which can be 400 mV for a typical process.

In some implementations, the amount of the current seen at the input terminals is reduced by the current mirror ratio n. Additionally or alternatively, the AC current seen at the input terminals is eliminated by connecting the compensation capacitors to small emitter-followers. By keeping the minimum required output voltage of the input buffer to $1*V_{CE\_SAT}$, the ADC input can swing down to 400 mV. With the prior approach, the minimum voltage would have been $2*V_{CE\_SAT}$, which would have been 800 mV. With the ADC power supply of 1.2 V, 400 mV less input swing would be a significant reduction in the signal swing at the ADC input. Moreover, reduction or elimination of the input AC current of the input buffer makes the external driver's job much easier.

A person of ordinary skill in the art will appreciate that the various circuits depicted above are merely illustrative and is not intended to limit the scope of the disclosure described herein. In particular, a load current compensation circuit may include any combination of electronic components that can perform the indicated operations. In addition, the operations performed by the illustrated components may, in some embodiments, be performed by fewer components or distributed across additional components. Similarly, in other embodiments, the operations of some of the illustrated components may not be provided and/or other additional operations may be available. Accordingly, systems and methods described herein may be implemented or executed with other circuit configurations.

It will be understood that various operations discussed herein may be executed simultaneously and/or sequentially. It will be further understood that each operation may be performed in any order and may be performed once or repetitiously.

Many modifications and other embodiments of the invention(s) will come to mind to one skilled in the art to which the invention(s) pertain having the benefit of the teachings presented in the foregoing descriptions, and the associated drawings. Therefore, it is to be understood that the invention(s) are not to be limited to the specific embodiments disclosed. Although specific terms are employed herein, they are used in a generic and descriptive sense only and not for purposes of limitation.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A differential input buffer, comprising:
   a first transistor ($Q_1$) having a collector terminal coupled to a power supply node, a base terminal coupled to a first differential input node and an emitter terminal coupled to a differential output node ($v_{OP}$);
   a current mirror including an input bias current ($I_{bias}$) source coupled to an input mirror node, and having an output mirror node coupled to the emitter terminal of the first transistor ($Q_1$); and
   a capacitor ($C_1$) coupled to the input mirror node, and to a second differential input node;
   wherein the first and second differential input nodes are coupled to receive alternating current (AC) differential inputs;
   the current mirror to provide a mirrored current ($I_{Q2}$) corresponding to the input bias current (Ibias) and an AC injection current ($I_{C1}$) based on the second AC differential input and the capacitor ($C_1$).

2. The input buffer of claim 1, wherein the differential output node ($v_{op}$) is coupled to a respective differential input of an analog-to-digital converter (ADC), including a sampling capacitor ($C_L$).

3. The input buffer of claim 2, wherein the current mirror comprises:
   a second transistor ($Q_2$) having a collector terminal coupled to an emitter terminal of the first transistor ($Q_1$);
   a third transistor ($Q_3$) having an emitter terminal coupled to an emitter terminal of the second transistor ($Q_2$) and to a ground node, a collector terminal coupled to the input bias current ($I_{bias}$) source, and a base terminal coupled the collector terminal and to a base terminal of the second transistor ($Q_2$); and the capacitor ($C_1$) to the input base terminals of the second and third transistors ($Q_2$ and $Q_3$).

4. The input buffer of claim 3, wherein the second transistor ($Q_2$) has a first size, wherein the third transistor ($Q_3$) has a second size, and wherein a ratio between the first and second sizes is n and effectively reduces the size of the capacitor ($C_1$).

5. The input buffer of claim 4, further comprising:
an emitter-follower transistor ($Q_{1S}$) having a collector terminal coupled to a power supply node, a base terminal coupled to the first differential input node, and an emitter terminal coupled to a current source ($I_{bias2}$) the emitter terminal providing a buffered first differential input.

6. The input buffer of claim 4, wherein a capacitance of the sampling capacitor ($C_L$) is n times larger than a capacitance of the capacitor ($C_1$).

7. The input buffer of claim 4, wherein a current ($I_{Q1}$) through the first transistor ($Q_1$) is n times larger than a biasing current ($I_{bias}$) provided by the input bias current source ($I_{bias}$).

8. A differential input buffer, comprising:
an input transistor ($Q_{1S}$) having a collector terminal coupled to a power supply node, a base terminal coupled to a first differential input node, and an emitter terminal coupled to a first current source ($I_{bias2}$);
an emitter-follower transistor ($Q_1$) having a collector terminal coupled to the power supply node and a base terminal coupled to the base terminal of the input transistor ($Q_{1S}$) and to the first differential input node;
a current mirror including:
a second transistor ($Q_2$) having a collector terminal coupled to an emitter terminal of the first transistor ($Q_1$);
a third transistor ($Q_3$) having an emitter terminal coupled to an emitter terminal of the second transistor ($Q_2$) and to a ground node, a collector terminal coupled to a second current source ($I_{bias}$) at an input mirror node, and a base terminal coupled the collector terminal and to a base terminal of the second transistor ($Q_2$); and
a capacitor ($C_1$) coupled to the input mirror node and to a first input node ($v_{onx}$).

9. The differential input buffer of claim 8, wherein a first differential output node ($v_{op}$) between the emitter terminal of the first transistor ($Q_1$) and the collector terminal of the second transistor ($Q_2$) is coupled to a first differential input of an analog-to-digital converter (ADC) comprising a sample-and-hold capacitor ($C_L$).

10. The differential input buffer of claim 9, wherein the second transistor ($Q_2$) has a first size, wherein the third transistor ($Q_3$) has a second size, wherein a ratio between the first and second sizes is n, wherein a capacitance of the sample-and-hold capacitor ($C_L$) is n times larger than a capacitance of the capacitor ($C_1$), and wherein a current ($I_{Q1}$) through the first transistor ($Q_1$) is n times larger than a biasing current ($I_{bias}$) provided by the second current source.

11. The differential input buffer of claim 9, further comprising:
another emitter-follower transistor ($Q_{1SN}$) having a collector terminal coupled to the power supply node, a base terminal coupled to a second differential input node ($v_{inn}$), and an emitter terminal coupled to a third current source ($I_{bias2N}$);
a fourth transistor ($Q_{1N}$) having a collector terminal coupled to the power supply node and a base terminal coupled to the base terminal of the other emitter-follower transistor ($Q_{1SN}$) and to the second differential input node ($v_{inn}$);
a fifth transistor ($Q_{2N}$) having a collector terminal coupled to an emitter terminal of the fourth transistor ($Q_{1N}$); and
a sixth transistor ($Q_{3N}$) having an emitter terminal coupled to an emitter terminal of the fifth transistor ($Q_{2N}$) and to a ground node, a collector terminal coupled to a third current source ($I_{biasN}$), and a base terminal coupled the collector terminal and to a base terminal of the fifth transistor ($Q_{2N}$); and
another capacitor ($C_{1N}$) coupled to the base terminals of the fifth and sixth transistors ($Q_{2N}$ and $Q_{3N}$) and to a second input node ($v_{opx}$).

12. The differential input buffer of claim 11, wherein a second differential output node ($v_{on}$) between the emitter terminal of the fourth transistor ($Q_{1N}$) and the collector terminal of the fifth transistor ($Q_{2N}$) is coupled to a second differential input of the analog-to-digital converter (ADC).

13. The differential input buffer of claim 11, wherein a node between the emitter terminal of the emitter-follower transistor ($Q_{1S}$) and the first current source ($I_{bias2}$) provides the voltage at the second input node ($v_{opx}$).

14. The differential input buffer of claim 13, wherein a node between the emitter terminal of the other emitter-follower transistor ($Q_{1SN}$) and the third current source ($I_{bias2N}$) provides the voltage at the first input node ($v_{onx}$).

15. A programmable input buffer, comprising:
an emitter-follower transistor ($Q_1$) having a collector terminal coupled to a power supply node and a base terminal coupled to an input node ($v_{inp}$);
a current mirror including
a second transistor ($Q_2$) having a collector terminal coupled to an emitter terminal of the emitter-follower transistor ($Q_1$);
a third transistor ($Q_3$) having an emitter terminal coupled to an emitter terminal of the second transistor ($Q_2$) and to a ground node, a collector terminal coupled to a current source ($I_{bias}$) at an input mirror node, and a base terminal coupled the collector terminal and to a base terminal of the second transistor ($Q_2$); and
a plurality of capacitors ($C_{1A-X}$), each coupled to the mirror node via a respective switch ($M_{1A-X}$).

16. The programmable input buffer of claim 15, wherein an output node ($v_{op}$) between the emitter terminal of the first transistor ($Q_1$) and the collector terminal of the second transistor ($Q_2$) is coupled to an input of an analog-to-digital converter (ADC).

17. The programmable input buffer of claim 16, wherein the output node ($v_{op}$) is coupled to a sample-and-hold capacitor ($C_L$) of the analog-to-digital converter (ADC).

18. The programmable input buffer of claim 17, wherein the second transistor ($Q_2$) has a first size, wherein the third transistor ($Q_3$) has a second size, and wherein a ratio between the first and second sizes is n.

19. The programmable input buffer of claim 17, wherein the plurality of switches ($M_{1A-X}$) are configured to increase or decrease a combined capacitance of the plurality of capacitors ($C_{1A-X}$) to match a capacitance of the sample-and-hold capacitor ($C_L$).

20. The programmable input buffer of claim 19, wherein the capacitance of the sample-and-hold capacitor ($C_L$) is n times larger than the combined capacitance of the plurality of capacitors ($C_{1A-X}$), and wherein a current ($I_{Q1}$) through the first transistor ($Q_1$) is n times larger than a biasing current ($I_{bias}$) provided by the current source.

* * * * *